US012797917B2

(12) United States Patent
Lee et al.

(10) Patent No.: US 12,797,917 B2
(45) Date of Patent: Nov. 17, 2026

(54) PHOTOMASK CLEANING APPARATUS

(71) Applicant: Gudeng Equipment Co., LTD., New Taipei City (TW)

(72) Inventors: Chung-Lin Lee, Tainan City (TW); Lin-Hsin Tu, Hsinchu City (TW); Wei-Yun Chen, Hsinchu County (TW); Fang-Yin Jhu, Kaohsiung City (TW); Ming-Mo Lo, Hsinchu County (TW); Hung-Che Lai, Tainan City (TW)

(73) Assignee: Gudeng Equipment Co., LTD., New Taipei City (TW)

( * ) Notice: Subject to any disclaimer, the term of this patent is extended or adjusted under 35 U.S.C. 154(b) by 169 days.

(21) Appl. No.: 18/815,869

(22) Filed: Aug. 27, 2024

(65) Prior Publication Data

US 2025/0375799 A1 Dec. 11, 2025

(30) Foreign Application Priority Data

Jun. 5, 2024 (TW) ................................ 113120826

(51) Int. Cl.
*B08B 3/10* (2006.01)
*B08B 13/00* (2006.01)
*G03F 1/82* (2012.01)

(52) U.S. Cl.
CPC ................ *B08B 3/10* (2013.01); *B08B 13/00* (2013.01); *G03F 1/82* (2013.01)

(58) Field of Classification Search
CPC .............. B08B 3/10; B08B 13/00; G03F 1/82
See application file for complete search history.

(56) References Cited

U.S. PATENT DOCUMENTS

2007/0068558 A1* 3/2007 Papanu ..................... G03F 1/82 134/29
2021/0301406 A1* 9/2021 Nakamura ............ C25B 11/077

FOREIGN PATENT DOCUMENTS

| | | | | |
|---|---|---|---|---|
| CN | 208389948 U | * | 1/2019 | |
| CN | 110508524 A | * | 11/2019 | ............ B08B 13/00 |
| KR | 20020093397 A | * | 12/2002 | ............... B08B 3/08 |
| KR | 102572215 B1 | * | 8/2023 | ....... H01L 21/67051 |
| TW | 503124 | | 9/2002 | |
| TW | 201509821 A | | 3/2015 | |
| TW | 1727573 B | | 5/2021 | |

OTHER PUBLICATIONS

CN110508524 translation (Year: 2019).*
CN208389948 translation (Year: 2019).*
KR20020093397 translation (Year: 2002).*
KR102572215 translation (Year: 2023).*

* cited by examiner

*Primary Examiner* — Levon J Shahinian
*Assistant Examiner* — Lauren G Orta
(74) *Attorney, Agent, or Firm* — Winston Hsu

(57) ABSTRACT

A photomask cleaning apparatus with a preferred static elimination function includes a cleaning device, a bearing base, an input tube and an output tube. The bearing base is disposed adjacent to the cleaning device and adapted to hold a photomask. The input tube is connected to the cleaning device, and adapted to guide ultrapure water with dissolved carbon dioxide towards the cleaning device for cleaning the photomask. The output tube is connected to the cleaning device, and adapted to drain the ultrapure water with the dissolved carbon dioxide for removing residual static electricity from the photomask.

6 Claims, 2 Drawing Sheets

PHOTOMASK CLEANING APPARATUS

BACKGROUND OF THE INVENTION

1. Field of the Invention

The present invention relates to a photomask cleaning apparatus and more particularly, to a photomask cleaning apparatus with a preferred static elimination function.

2. Description of the Prior Art

A conventional photomask cleaning apparatus utilize ultrapure water to clean a photomask; during the cleaning process, the photomask may rub against the napery to generate static electricity. The ultrapure water is an insulator, and the static electricity remains on the photomask. If the residual static electricity on the photomask is not quickly removed, the photomask is damaged when the accumulated static electricity exceeds a preset threshold. The conventional photomask cleaning apparatus is equipped with an additional static eliminator to eliminate the residual static electricity on the photomask. If the static eliminator is placed close to the photomask, the static eliminator may easily hit and damage the photomask; if the static eliminator is placed far from the photomask, the static elimination performance of the static eliminator is reduced. Thus, design of a photomask cleaning apparatus of decreasing a damage risk of the photomask and increasing the static elimination performance is an important issue in the semiconductor equipment industry.

SUMMARY OF THE INVENTION

The present invention provides a photomask cleaning apparatus with a preferred static elimination function for solving above drawbacks.

According to the claimed invention, a photomask cleaning apparatus with a preferred static elimination function includes a cleaning device, a bearing base, an input tube and an output tube. The bearing base is disposed adjacent to the cleaning device and adapted to hold a photomask. The input tube is connected to the cleaning device, and adapted to receive ultrapure water with dissolved carbon dioxide and then guide the ultrapure water with the dissolved carbon dioxide towards the cleaning device for cleaning the photomask. The output tube is connected to the cleaning device, and adapted to drain the ultrapure water with the dissolved carbon dioxide out of the bearing base for removing residual static electricity from the photomask.

According to the claimed invention, the photomask cleaning apparatus further includes a liquid storage sink connected to the input tube and adapted to store the ultrapure water. The photomask cleaning apparatus further includes a flow meter and a gas storage sink, the gas storage sink is adapted to store the carbon dioxide, the flow meter is connected between the gas storage sink and the input tube and adapted to control a flow rate of the carbon dioxide discharged from the gas storage sink. The photomask cleaning apparatus further includes a liquid resistance tester disposed between the input tube and the cleaning device, and adapted to test whether a resistance value of the ultrapure water with the dissolved carbon dioxide conforms to a preset condition. The photomask cleaning apparatus further includes an alarm unit electrically connected to the liquid resistance tester, and adapted to output a reminder signal when the resistance value does not conform to the preset condition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
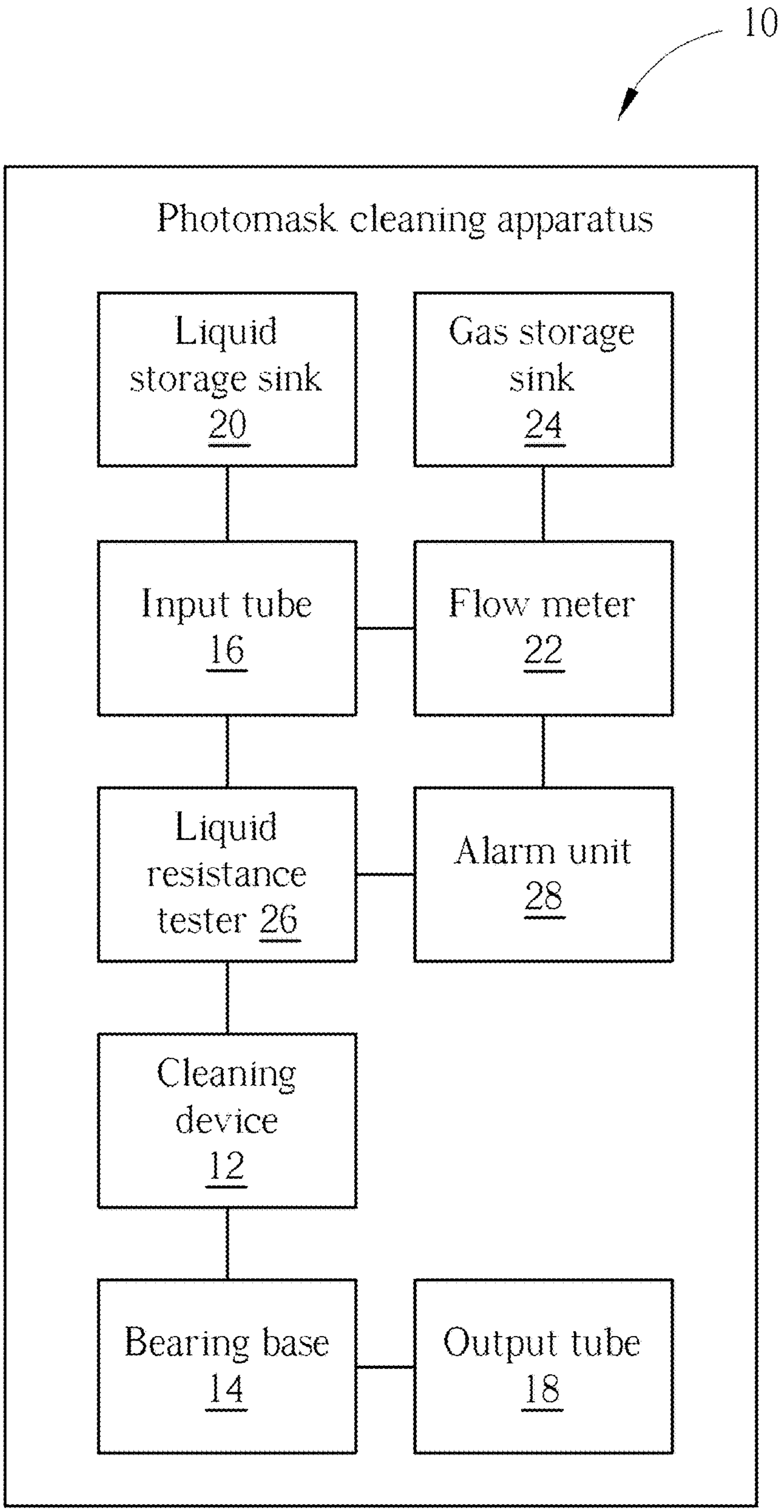
FIG. 1 is a functional block diagram of a photomask cleaning apparatus according to an embodiment of the present invention.

Please refer to FIG. 1. FIG. 1 is a functional block diagram of a photomask cleaning apparatus 10 according to an embodiment of the present invention. The photomask cleaning apparatus 10 of the present invention is not limited to any specific architecture, and an actual architecture of the photomask cleaning apparatus 10 can be omitted for simplicity. The photomask cleaning apparatus 10 can at least include a cleaning device 12, a bearing base 14, an input tube 16, an output tube 18, a liquid storage sink 20, a flow meter 22, a gas storage sink 24, a liquid resistance tester 26 and an alarm unit 28. The cleaning device 12 and the bearing base 14 can be common types, and a detailed description is omitted herein. The bearing base 14 can be disposed adjacent to the cleaning device 12 and used to hold a photomask prepared to be cleaned.

The input tube 16 can be the Venturi tube, or any tube with a similar function. The Venturi tube can refer to the tube fittings with changes in the cross-section. By reducing the cross-section of some part of the tube, the flow rate through the foresaid part can be increased and a pressure difference can be generated accordingly, so as to measure the flow rate because of the known pressure difference. The input tube 16 may be the common tube different from the Venturi tube, and other possible application is not introduced herein for simplicity. The input tube 16 can be connected to the liquid storage sink 20, and used to receive ultrapure water stored inside the liquid storage sink 20. The flow meter 22 can be connected between the gas storage sink 24 and the input tube 16. The gas storage sink 24 can store carbon dioxide. The flow meter 22 can control the flow rate of the carbon dioxide discharged from the gas storage sink 24, and the input tube 16 can drain the ultrapure water with the dissolved carbon dioxide.

The liquid resistance tester 26 can be connected between the input tube 16 and the cleaning device 12. The input tube 16 can guide the ultrapure water with the dissolved carbon dioxide towards the cleaning device 12 through the liquid resistance tester 26, so as to clean the photomask. At the same time, the liquid resistance tester 26 can test whether a resistance value of the ultrapure water with the dissolved carbon dioxide conforms to a preset condition; the preset condition can be a specific range of the resistance value, and an actual value of the specific range can depend on a design demand. When the resistance value conforms to the preset condition, the liquid resistance tester 26 can allow the ultrapure water with the dissolved carbon dioxide to flow towards the cleaning device 12 for cleaning the photomask.

The liquid resistance tester 26 can be further electrically connected to the alarm unit 28; when the resistance value does not conform to the preset condition, the liquid resistance tester 26 can transmit a control command to drive the alarm unit 28 to output a reminder signal. The reminder signal can be a sound signal, a lighting signal, a vibration signal, or a combination of the sound signal and the lighting signal and the vibration signal. A type of the reminder signal is not limited to the foresaid embodiment; for example, the reminder signal may be an operation command that prevents the liquid resistance tester 26 from allowing the ultrapure water with the dissolved carbon dioxide to flow towards the cleaning device 12. Variation of the reminder signal can depend on the design demand.

Besides, the alarm unit 28 can be electrically connected to the flow meter 22. When the resistance value does not conform to the preset condition, the alarm unit 28 can output the reminder signal in accordance with the control command of the liquid resistance tester 26, and further can drive the flow meter 22 to adjust the flow rate of the carbon dioxide discharged from the gas storage sink 20 in accordance with a detection result of the liquid resistance tester 26 (which means the resistance value of the ultrapure water with the dissolved carbon dioxide), so as to control conductivity of the ultrapure water with the dissolved carbon dioxide, and therefore the resistance value of the ultrapure water with the dissolved carbon dioxide can conform to the preset condition via foresaid adjustment.

The cleaning device 12 can clean the photomask on the bearing base 14 by the ultrapure water with the dissolved carbon dioxide. The carbon dioxide can be dissociated in the ultrapure water to produce hydrogen ions ($H+$) and bicarbonate ions ($HCO3-$). The hydrogen ions and the bicarbonate ions can be used to remove static electricity generated by friction between the photomask and the napery. The output tube 18 can be connected to the cleaning device 12, and used to drain the ultrapure water with the dissolved carbon dioxide out of the cleaning device 12 and/or the bearing base 14 after cleaning the photomask, for removing residual static electricity from the photomask. Therefore, the photomask cleaning apparatus 10 of the present invention does not require an additional static eliminator, and is not limited to the distance requirement of the static eliminator, and can still provide the preferred static elimination function by changing the mask rinse solution to become a conductor.

Generally, the ultrapure water can refer to liquid water with a specific impedance value reaching 18.2 MΩ·cm at 25 degrees Celsius. Concentration of the carbon dioxide dissolved in the ultrapure water can affect the conductivity of the ultrapure water with the dissolved carbon dioxide; however, the present invention does not limit the concentration, the conductivity and the dissolution time of the ultrapure water with the dissolved carbon dioxide, which depend on the design demand and the actual demand; any rinse solution of changing the ultrapure water into the conductor so that the static electricity cannot be accumulated on the photomask during a cleaning process can belong to a design purpose of the present invention.

Figure 2:
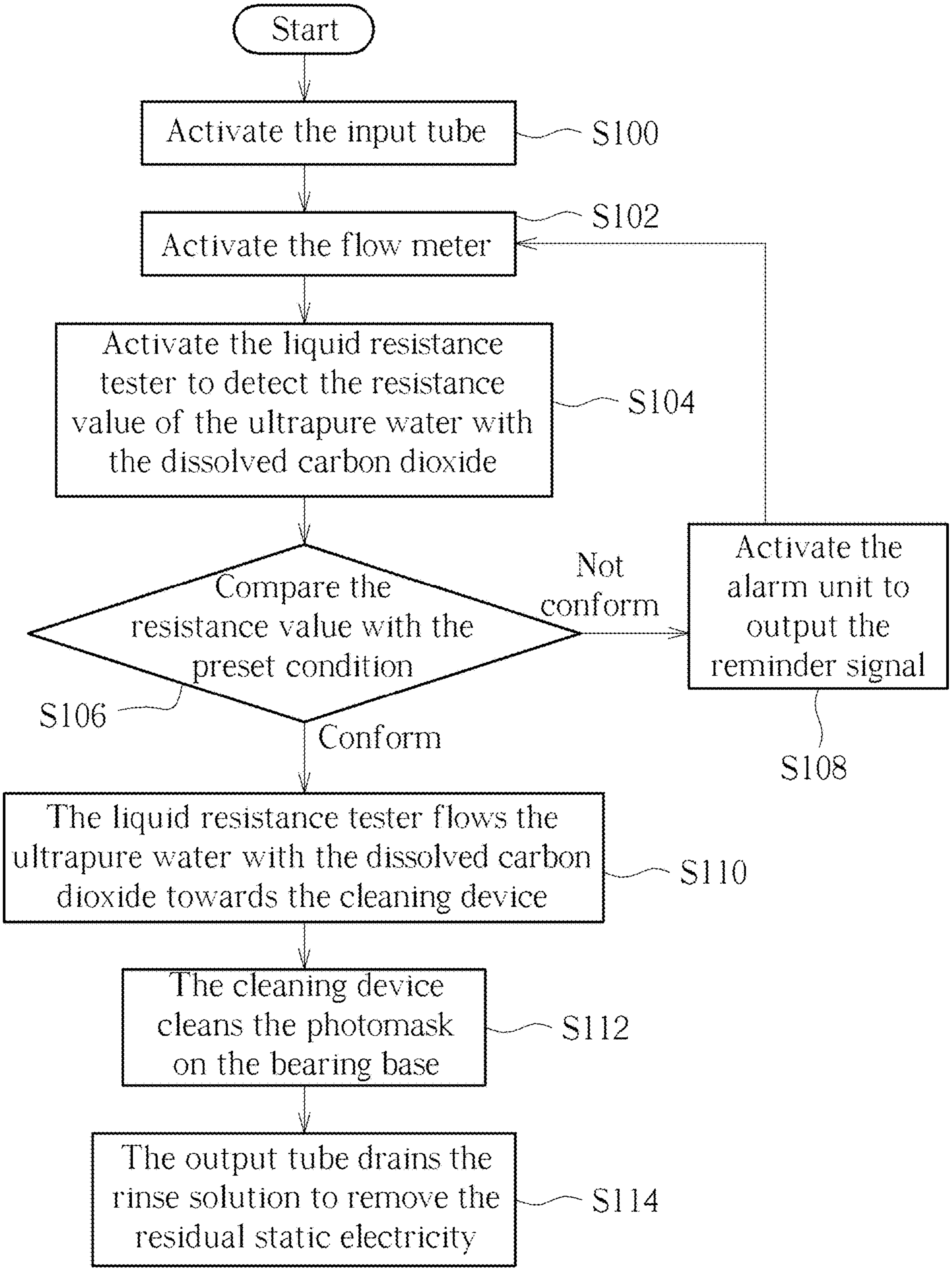
FIG. 2 is a flow chart of the photomask cleaning apparatus during the cleaning process according to the embodiment of the present invention.

Please refer to FIG. 2. FIG. 2 is a flow chart of the photomask cleaning apparatus 10 during the cleaning process according to the embodiment of the present invention. First, step S100 and step S102 can be executed to activate the input tube 16 and the flow meter 22; the ultrapure water stored in the liquid storage sink 20 is originally the non-conductor. The flow meter 22 can guide the carbon dioxide from the gas storage sink 24 into the input tube 16, and the input tube 16 can receive the ultrapure water from the liquid storage sink 20 and the carbon dioxide from the flow meter 22 simultaneously, so as to mix the ultrapure water and the carbon dioxide for producing conducting ions. Then, step S104 and step S106 can be executed to activate the liquid resistance tester 26 for detecting the resistance value of the ultrapure water with the dissolved carbon dioxide, and compare the resistance value with the preset condition. If the resistance value does not conform to the preset condition, step S108 can be executed to activate the alarm unit 28 for outputting the reminder signal; the alarm unit 28 can be used to optionally control the discharge flow of the flow meter 22.

If the resistance value conforms to the preset condition, step S110, step S112 and step S114 can be executed that the liquid resistance tester 26 can flow the ultrapure water with the dissolved carbon dioxide towards the cleaning device 12, the cleaning device 12 can clean the photomask on the bearing base 14, and the ultrapure water with the dissolved carbon dioxide after cleaning the photomask can be drained to remove the residual static electricity because the ultrapure water with the dissolved carbon dioxide may generate the residual static electricity in the cleaning process, so that the static electricity is not accumulated on the photomask, which can effectively reduce possibility of static electricity damage to the photomask in the subsequent process, and help to improve market competition of the photomask cleaning apparatus 10 in the related industry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photomask cleaning apparatus with a preferred static elimination function comprising:

- a cleaning device;
- a bearing base disposed adjacent to the cleaning device and adapted to hold a photomask;
- an input tube connected to the cleaning device, and adapted to receive ultrapure water with dissolved carbon dioxide and then guide the ultrapure water with the dissolved carbon dioxide towards the cleaning device for cleaning the photomask;
- a liquid resistance tester disposed between the input tube and the cleaning device, and configured to determine whether a resistance value of the ultrapure water with dissolved carbon dioxide conforms to a preset condition, wherein the ultrapure water with dissolved carbon dioxide is allowed to enter the cleaning device only when the resistance value conforms to the preset condition; and
- an output tube connected to the cleaning device, and adapted to drain the ultrapure water with the dissolved carbon dioxide out of the bearing base to carry away residual electrostatic charges removed from the photomask.

2. The photomask cleaning apparatus of claim 1, wherein the photomask cleaning apparatus further comprises a liquid storage sink connected to the input tube and adapted to store the ultrapure water.

3. The photomask cleaning apparatus of claim 1, wherein the photomask cleaning apparatus further comprises a flow meter and a gas storage sink, the gas storage sink is adapted to store the carbon dioxide, the flow meter is connected between the gas storage sink and the input tube and adapted to control a flow rate of the carbon dioxide discharged from the gas storage sink.

4. The photomask cleaning apparatus of claim 1, wherein the photomask cleaning apparatus further comprises an alarm unit electrically connected to the liquid resistance tester, and adapted to output a reminder signal when the resistance value does not conform to the preset condition.

5. The photomask cleaning apparatus of claim 4, wherein the alarm unit is further electrically connected to the flow meter, and the flow meter is adapted to adjust the flow rate of the carbon dioxide discharged from the gas storage sink for controlling conductivity of the ultrapure water with the dissolved carbon dioxide when the resistance value does not conform to the preset condition.

6. The photomask cleaning apparatus of claim 1, wherein the ultrapure water refers to liquid water with a specific impedance value reaching 18.2 MΩ·cm at 25 degrees Celsius.

* * * * *